US011205658B2

(12) United States Patent
Xu et al.

(10) Patent No.: US 11,205,658 B2
(45) Date of Patent: Dec. 21, 2021

(54) THREE-DIMENSIONAL MEMORY DEVICE WITH CORROSION-RESISTANT COMPOSITE SPACER

(71) Applicant: YANGTZE MEMORY TECHNOLOGIES CO., LTD., Wuhan (CN)

(72) Inventors: Bo Xu, Wuhan (CN); Ping Yan, Wuhan (CN); Chuan Yang, Wuhan (CN); Jing Gao, Wuhan (CN); Zongliang Huo, Wuhan (CN); Lu Zhang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 211 days.

(21) Appl. No.: 16/137,628

(22) Filed: Sep. 21, 2018

(65) Prior Publication Data
US 2020/0035700 A1    Jan. 30, 2020

Related U.S. Application Data

(63) Continuation of application No. PCT/CN2018/096783, filed on Jul. 24, 2018.

(51) Int. Cl.
*H01L 29/51*    (2006.01)
*H01L 27/11582*    (2017.01)
(Continued)

(52) U.S. Cl.
CPC .. *H01L 27/11582* (2013.01); *H01L 21/02164* (2013.01); *H01L 21/02178* (2013.01);
(Continued)

(58) Field of Classification Search
CPC ........... H01L 27/1157; H01L 27/02164; H01L 27/11578; H01L 27/11582;
(Continued)

(56) References Cited

U.S. PATENT DOCUMENTS 9,806,256 B1 * 10/2017 Wu ..................... H01L 45/1266
10,354,987 B1 * 7/2019 Mushiga ............. H01L 27/0688
(Continued)

FOREIGN PATENT DOCUMENTS

CN        107968091 A    4/2018
CN        107968093 A    4/2018
(Continued)

OTHER PUBLICATIONS

International Search Report issued in corresponding International Application No. PCT/CN2018/096783, dated Apr. 29, 2019, 4 pages.
(Continued)

*Primary Examiner* — Eric K Ashbahian
(74) *Attorney, Agent, or Firm* — Baye PLLC

(57)    ABSTRACT

Embodiments of a three-dimensional (3D) memory device with a corrosion-resistant composite spacer and method for forming the same are disclosed. In an example, a 3D memory device includes a substrate, a memory stack disposed on the substrate and including a plurality of conductor/dielectric layer pairs, a plurality of memory strings each extending vertically through the memory stack, a slit contact disposed laterally between the plurality of memory strings, and a composite spacer disposed laterally between the slit contact and at least one of the memory strings. The composite spacer includes a first silicon oxide film, a second silicon oxide film, and a dielectric film disposed laterally between the first silicon oxide film and the second silicon oxide film.

18 Claims, 11 Drawing Sheets

(51) Int. Cl.
| | |
|---|---|
| *H01L 21/02* | (2006.01) |
| *H01L 23/522* | (2006.01) |
| *H01L 23/528* | (2006.01) |
| *H01L 23/532* | (2006.01) |
| *H01L 27/11565* | (2017.01) |
| *H01L 29/10* | (2006.01) |
| *H01L 21/28* | (2006.01) |
| *H01L 21/768* | (2006.01) |

(52) U.S. Cl.
CPC ........ *H01L 23/528* (2013.01); *H01L 23/5226* (2013.01); *H01L 23/53257* (2013.01); *H01L 27/11565* (2013.01); *H01L 29/1037* (2013.01); H01L 21/0228 (2013.01); H01L 21/02236 (2013.01); H01L 21/02255 (2013.01); H01L 21/02271 (2013.01); H01L 21/76802 (2013.01); H01L 21/76877 (2013.01); H01L 29/40117 (2019.08); H01L 29/513 (2013.01); H01L 29/518 (2013.01)

(58) Field of Classification Search
CPC ............. H01L 27/02178; H01L 27/762; H01L 27/11524; H01L 27/022; H01L 27/0688; H01L 27/11551; H01L 21/02164; H01L 21/02304; H01L 29/66833; H01L 29/40114; H01L 29/7889; H01L 29/6656; H01L 29/792; H01L 23/53295; G11C 16/0483
See application file for complete search history.

(56) References Cited

U.S. PATENT DOCUMENTS

| | | | |
|---|---|---|---|
| 2006/0042651 A1* | 3/2006 | Verhaverbeke | C11D 11/0047 134/1 |
| 2009/0087977 A1* | 4/2009 | Spuller | H01L 27/11519 438/593 |
| 2011/0074013 A1* | 3/2011 | Ueda | H01L 21/76224 257/734 |
| 2013/0228852 A1* | 9/2013 | Kitazaki | H01L 27/11582 257/329 |
| 2013/0248974 A1 | 9/2013 | Alsmeier et al. | |
| 2016/0056167 A1 | 2/2016 | Wang et al. | |
| 2016/0225786 A1 | 8/2016 | Lee et al. | |
| 2016/0247816 A1 | 8/2016 | Kuniya | |
| 2016/0336338 A1* | 11/2016 | Song | H01L 23/5226 |
| 2017/0250193 A1* | 8/2017 | Huo | H01L 27/11582 |
| 2017/0373086 A1* | 12/2017 | Pang | H01L 21/31111 |
| 2020/0006641 A1* | 1/2020 | Liou | H01L 43/02 |

FOREIGN PATENT DOCUMENTS

| | | |
|---|---|---|
| TW | 276355 B | 5/1996 |
| TW | 201810621 A | 3/2018 |
| TW | 201814793 A | 4/2018 |

OTHER PUBLICATIONS

Written Opinion of the International Searching Authority issued in corresponding International Application No. PCT/CN2018/096783, dated Apr. 29, 2019, 4 pages.

* cited by examiner

THREE-DIMENSIONAL MEMORY DEVICE WITH CORROSION-RESISTANT COMPOSITE SPACER

CROSS REFERENCE TO RELATED APPLICATION

This application is continuation of International Application No. PCT/CN2018/096783, filed on Jul. 24, 2018, entitled "THREE-DIMENSIONAL MEMORY DEVICE WITH CORROSION-RESISTANT COMPOSITE SPACER," which is hereby incorporated by reference in its entirety.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices with a corrosion-resistant composite spacer and methods for forming the same are disclosed herein.

In one example, a 3D memory device includes a substrate, a memory stack disposed on the substrate and including a plurality of conductor/dielectric layer pairs, a plurality of memory strings each extending vertically through the memory stack, a slit contact disposed laterally between the plurality of memory strings, and a composite spacer disposed laterally between the slit contact and at least one of the memory strings. The composite spacer includes a first silicon oxide film, a second silicon oxide film, and a dielectric film disposed laterally between the first silicon oxide film and the second silicon oxide film.

In another example, a semiconductor device includes a substrate, a conductor layer disposed above the substrate, a contact extending vertically through the conductor layer, and a composite spacer disposed laterally between the contact and the conductor layer. The composite spacer includes a low-temperature silicon oxide film, a high-temperature silicon oxide film, and a high dielectric constant (high-k) dielectric film disposed laterally between the low-temperature silicon oxide film and the high-temperature silicon oxide film.

In a different example, a method for forming a 3D memory device is disclosed. A dielectric stack including a plurality of dielectric/sacrificial layer pairs is formed on a substrate. A memory string extending vertically through the dielectric stack is formed. A slit extending vertically through the dielectric stack is formed. A memory stack is formed on the substrate including a plurality of conductor/dielectric layer pairs by replacing, with a plurality of conductor layers, the sacrificial layers in the dielectric/sacrificial layer pairs through the slit. A composite spacer is formed along a sidewall of the slit. The composite spacer includes a first silicon oxide film, a second silicon oxide film, and a dielectric film formed laterally between the first silicon oxide film and the second silicon oxide film. A slit contact extending vertically in the slit is formed.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
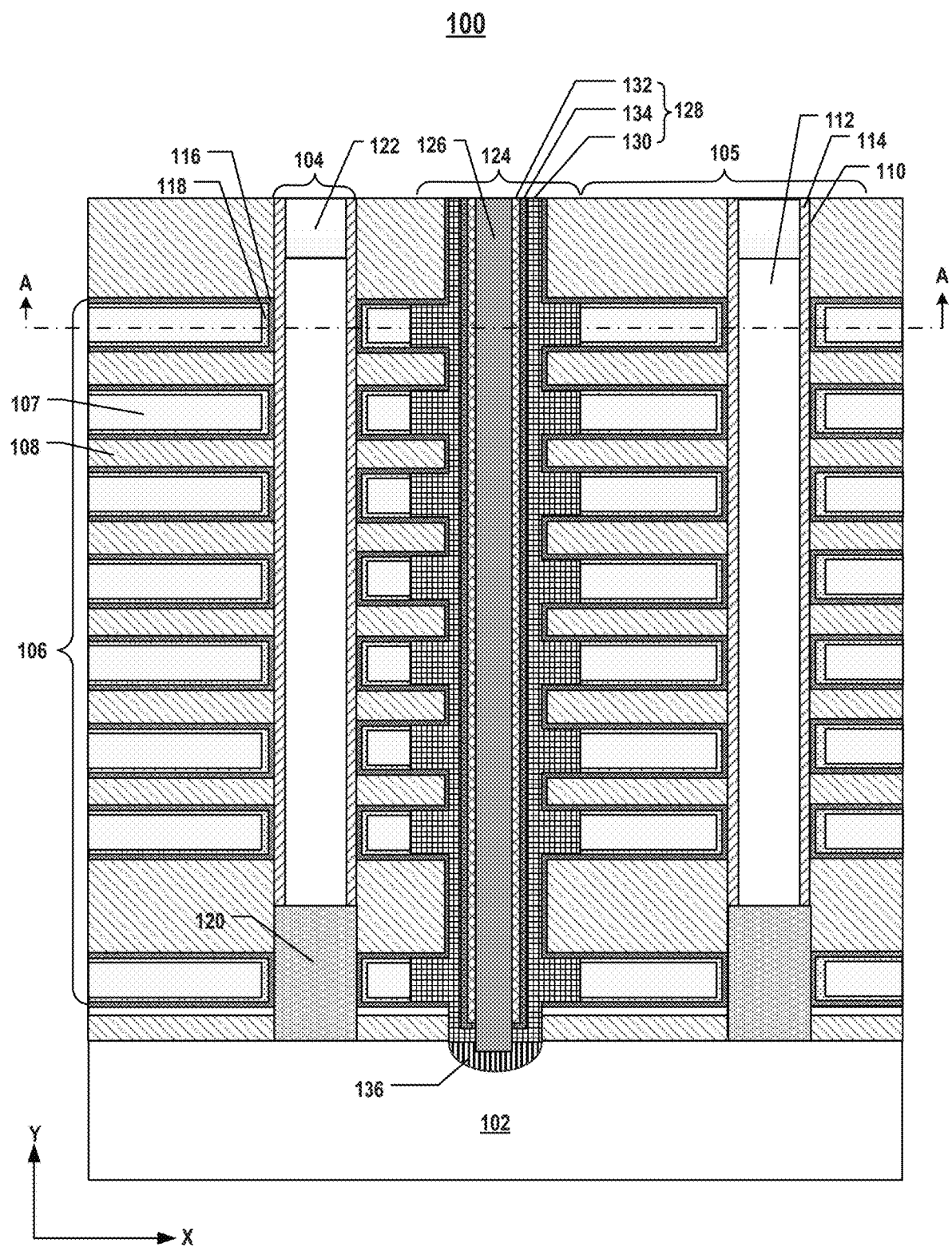
FIG. 1 illustrates a cross-section of an exemplary 3D memory device with a corrosion-resistant composite spacer, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense.

Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D memory devices, spacers are used to electrically separate gate conductors of memory cells (i.e., word lines of the 3D memory devices) and contacts in gate line slits (GLSs, e.g., for array common source (ACS) fan-out). For example, spacer oxide can be used between gate conductors made from tungsten (W) and contacts in the GLSs for insulation, as well as a barrier preventing tungsten diffusion. High-temperature oxide film is known as a good spacer oxide because of its high-quality. However, for tungsten gate conductors fabricated by chemical vapor deposition (CVD) process using tungsten hexafluoride ($WF_6$) as the precursor, there will be a certain amount of fluorine (F) remaining in the aperture of the tungsten gate conductors after tungsten deposition. The fluorine residue will leak out during the next thermal process for fabricating the high-temperature oxide film and thus, erode the spacer oxide. The corrosion can reduce the thickness of the spacer, thereby increasing the leakage risk and reducing the reliability of the 3D memory devices.

Various embodiments in accordance with the present disclosure provide a 3D memory device with a corrosion-resistant composite spacer. By including an additional film with corrosion resistance in the spacer, spacer oxide films can be kept away from damage by fluorine which remained during tungsten gate deposition. In some embodiments, the composite spacer can include a low-temperature silicon oxide film protecting the tungsten gate conductors for oxidation by later high-temperature process and a high-temperature silicon oxide film acting as an electrical insulator and tungsten-diffusion barrier. The composite spacer can further include a corrosion-resistant dielectric film between the two silicon oxide films to prevent the damage to the high-temperature silicon oxide film caused by the diffusion of fluorine atoms and/or ions during the high-temperature thermal oxidation process.

Moreover, in some embodiments, the corrosion-resistant dielectric film can include high-k dielectric materials, such as aluminum oxide ($Al_2O_3$, also known as "alumina"). The high-k property of the corrosion-resistant dielectric film can reduce the leakage risk, thereby further improving the reliability of the 3D memory device.

FIG. 1 illustrates a cross-section of an exemplary 3D memory device 100 with a corrosion-resistant composite spacer 128, according to some embodiments of the present disclosure. 3D memory device 100 can include a substrate 102, which can include silicon (e.g., single crystalline silicon), silicon germanium (SiGe), gallium arsenide (GaAs), germanium (Ge), silicon on insulator (SOI), germanium on insulator (GOI), or any other suitable materials. In some embodiments, substrate 102 is a thinned substrate (e.g., a semiconductor layer), which was thinned by grinding, wet/dry etching, chemical mechanical polishing (CMP), or any combination thereof.

3D memory device 100 can include a memory array device disposed above substrate 102, such as an array of NAND memory strings 104, as shown in FIG. 1. It is noted that x and y axes are included in FIG. 1 to further illustrate the spatial relationship of the components in 3D memory device 100. Substrate 102 includes two lateral surfaces (e.g., a top surface and a bottom surface) extending laterally in the x-direction (i.e., the lateral direction). As used herein, whether one component (e.g., a layer or a device) is "on," "above," or "below" another component (e.g., a layer or a device) of a semiconductor device (e.g., 3D memory device 100) is determined relative to the substrate of the semiconductor device (e.g., substrate 102) in the y-direction (i.e., the vertical direction) when the substrate is positioned in the lowest plane of the semiconductor device in the y-direction. The same notion for describing spatial relationship is applied throughout the present disclosure.

3D memory device 100 can be part of a monolithic 3D memory device. The term "monolithic" means that the components (e.g., the peripheral device and memory array device) of the 3D memory device are formed on a single substrate. For monolithic 3D memory devices, the fabrication encounters additional restrictions due to the convolution of the peripheral device processing and the memory array device processing. For example, the fabrication of memory array device (e.g., NAND memory strings) is constrained by the thermal budget associated with the peripheral devices that have been formed or to be formed on the same substrate.

In contrast, 3D memory device 100 can be part of a non-monolithic 3D memory device, in which components (e.g., the peripheral device and memory array device) can be formed separately on different substrates and then bonded, for example, in a face-to-face manner. In some embodiments, the memory array device substrate (e.g., substrate 102) remains as the substrate of the bonded non-monolithic 3D memory device, and the peripheral device (e.g., any suitable digital, analog, and/or mixed-signal peripheral circuits used for facilitating the operation of 3D memory device 100, such as page buffers, decoders, and latches; not shown) is flipped and faces down toward the memory array device (e.g., NAND memory strings 104) for hybrid bonding. It is understood that in some embodiments, the memory array device substrate (e.g., substrate 102) is flipped and faces down toward the peripheral device (not shown) for hybrid bonding, so that in the bonded non-monolithic 3D memory device, the memory array device is above the peripheral device. The memory array device substrate (e.g., substrate 102) can be a thinned substrate (which is not the substrate of the bonded non-monolithic 3D memory device), and the back-end-of-line (BEOL) interconnects of the non-monolithic 3D memory device can be formed on the backside of the thinned memory array device substrate.

In some embodiments, 3D memory device 100 is a NAND Flash memory device in which memory cells are provided in the form of array of NAND memory strings 104 extending vertically above substrate 102. The memory array device can include NAND memory strings 104 that extend through a plurality of pairs each including a conductor layer 107 and a dielectric layer 108 (referred to herein as "conductor/dielectric layer pairs"). The stacked conductor/dielectric layer pairs are also referred to herein as a "memory stack" 106. The number of the conductor/dielectric layer pairs in memory stack 106 (e.g., 32, 64, 96, or 128) can set the number of memory cells in 3D memory device 100. Conductor layers 107 and dielectric layers 108 in memory stack 106 can alternate in the vertical direction. In other words, except the ones at the top and the bottom of memory stack 106, each conductor layer 107 can be adjoined by two dielectric layers 108 on both sides, and each dielectric layer 108 can be adjoined by two conductor layers 107 on both sides. Conductor layers 107 can each have the same thickness or have different thicknesses. Similarly, dielectric layers 108 can each have the same thickness or have different thicknesses. Conductor layers 107 can include conductive materials including, but not limited to, W, cobalt (Co), copper (Cu), aluminum (Al), polycrystalline silicon (polysilicon), doped silicon, silicides, or any combination thereof. Dielectric layers 108 can include dielectric materials including, but not limited to, silicon oxide, silicon nitride, silicon oxynitride, or any combination thereof.

As shown in FIG. 1, each NAND memory string 104 can include a channel structure 110 extending vertically through memory stack 106. Channel structure 110 can include a channel hole filled with semiconductor material(s) (e.g., as a semiconductor channel 112) and dielectric material(s) (e.g., as a memory film 114). In some embodiments, semiconductor channel 112 includes silicon, such as amorphous silicon, polysilicon, or single crystalline silicon. In some embodiments, memory film 114 is a composite layer including a tunneling layer, a storage layer (also known as a "charge trap/storage layer"), and a blocking layer. Each NAND memory string 104 can have a cylinder shape (e.g., a pillar shape). Semiconductor channel 112, the tunneling layer, the storage layer, and the blocking layer are arranged radially from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high-k dielectrics, or any combination thereof. In one example, the blocking layer can include a composite layer of silicon oxide/silicon oxynitride/silicon oxide (ONO). In another example, the blocking layer can include high-k dielectric materials, such as aluminum oxide ($Al_2O_3$), hafnium oxide ($HfO_2$) or tantalum oxide ($Ta_2O_5$).

In some embodiments, NAND memory string 104 and memory stack 106 collectively from NAND memory cell stacks 105. Conductor layer 107 (each being part of a word line) in memory stack 106 can function as a gate conductor of memory cells in NAND memory cell stack 105. Conductor layer 107 can include multiple control gates of multiple NAND memory cell stacks 105 and can extend laterally as a word line ending at the edge of memory stack 106 (e.g., in a staircase structure of memory stack 106). In some embodiments, NAND memory cell stack 105 further includes a gate dielectric layer 116 and a glue layer 118 disposed laterally between conductor layer 107 and memory film 114. Gate dielectric layer 116 can increase the gate capacitance of each memory cell, as well as suppress the leakage current from one gate to its neighboring gates due to its all-around coverage on the control gate. Gate dielectric layer 116 can include materials including, but not limited to, silicon nitride, high-k dielectrics, such as aluminum oxide ($Al_2O_3$), hafnium oxide ($HfO_2$) or tantalum oxide ($Ta_2O_5$), or any combination thereof. Glue layer 118 (also known as an "adhesion layer," "seed layer," or "barrier layer") can include one or more layers for increasing the adhesion between conductor layer 107 (the gate conductor) and gate dielectric layer 116. The materials of glue layer 118 can include, but are not limited to, titanium (Ti), titanium nitride (TiN), tantalum (Ta), tantalum nitride (TaN), or any combination thereof. In some embodiments, NAND memory cell stack 105 includes a gate conductor layer 107 made from tungsten, glue layer 118 including Ti/TiN, gate dielectric layer 116 made from a high-k dielectric material, and channel structure 110.

In some embodiments, NAND memory string 104 includes two semiconductor plugs 120 and 122 each at a respective end in the vertical direction. Each of semiconductor plugs 120 and 122 can be in contact with a respective end of channel structure 110. Semiconductor plug 120 can be at the lower end of NAND memory string 104 and in contact with channel structure 110 (e.g., on the lower end of channel structure 110) and substrate 102. As used herein, the "upper end" of a component (e.g., NAND memory string 104) is the end farther away from substrate 102 in the y-direction, and the "lower end" of the component (e.g., NAND memory string 104) is the end closer to substrate 102 in the y-direction when substrate 102 is positioned in the lowest plane of 3D memory device 100. Semiconductor plug 120 can include a semiconductor material, such as silicon, which is epitaxially grown from substrate 102. It is understood that in some embodiments, semiconductor plug 120 includes single crystalline silicon that is part of substrate 102. Semiconductor plug 120 can function as a channel controlled by a source select gate of NAND memory string 104.

Semiconductor plug 122 can be at the upper end of NAND memory string 104 and in contact with channel structure 110 (e.g., on the upper end of channel structure 110). Semiconductor plug 122 can include semiconductor materials (e.g., polysilicon) or conductive materials (e.g., metals). In some embodiments, semiconductor plug 122 includes an opening filled with Ti/TiN as a glue layer and tungsten as a conductor. By covering the upper end of channel structure 110 during the fabrication of 3D memory device 100, semiconductor plug 122 can function as an etch stop layer to prevent etching of dielectrics filled in channel structure 110, such as silicon oxide and silicon nitride. In some embodiments, semiconductor plug 122 also functions as the drain of NAND memory string 104.

As shown in FIG. 1, 3D memory device 100 further includes slit structures 124. Each slit structure 124 can extend vertically through memory stack 106. Slit structure 124 can also extend laterally to separate memory stack 106 into multiple blocks. Slit structure 124 can include a slit contact 126, formed by filling the slit opening with conductive materials including, but not limited to, W, Co, Cu, Al, polysilicon, silicides, or any combination thereof. Slit structure 124 can further include a composite spacer 128 disposed laterally between slit contact 126 and NAND memory string 104 to electrically insulate slit contact 126 from surrounding conductor layers 107 (the gate conductors) in NAND memory cell stacks 105. As a result, slit structures 124 can separate 3D memory device 100 into multiple memory blocks and/or memory fingers.

In some embodiments, composite spacer 128 includes a first silicon oxide film 130 and a second silicon oxide film 132 stacked laterally between NAND memory cell stack 105 (and NAND memory string 104 therein) and slit contact 126. First silicon oxide film 130 can include a low-temperature silicon oxide film formed by a low-temperature process to prevent conductor layer 107 from oxidation. In contrast, second silicon oxide film 132 can include a high-temperature silicon oxide film formed by a high-temperature process, such that its film quality is higher than its low-temperature counterpart. During the growth of second silicon oxide film 132, since conductor layer 107 has already been insulated by first silicon oxide film 130, oxidation of conductor layer 107 can be avoided. In some embodiments, the low-temperature process is performed not higher than about 400° C. (e.g., below 400° C.), while the high-temperature process is performed not lower than about 400° C. (e.g., above 400° C.). In some embodiments, the low-temperature process is performed not higher than about 600° C. (below 600° C.), while the high-temperature process is performed not lower than about 600° C. (e.g., above 600° C.). The low-temperature process and high-temperature process can be the same type of process, such as CVD or atomic layer deposition (ALD), but preformed at different temperatures. Or the low-temperature process and high-temperature process can be different processes. For example, the low-temperature process is low-temperature (LT) CVD or ALD, and the high-temperature process is thermal oxidation.

In some embodiments, a dielectric film 134 is disposed laterally between first silicon oxide film 130 and second silicon oxide film 132. Dielectric film 134 can act as a barrier preventing the fluorine atoms and/or ions, left behind by the prior gate forming process, from further corroding the oxide films (e.g., second silicon oxide film 132). For example, fluorine atoms or ions can still lurk in conductor layer 107 with tungsten formed by decomposition tungsten hexafluoride precursor in a CVD process, even after a thorough cleaning process. The fluorine atoms and/or ions can gradually migrate toward the oxide film (e.g., second silicon oxide film 132), degradation or even compromising the insulation property of the oxide film. It is understood that in forming conductor layers 107 with conductive materials other than tungsten, fluoride-based precursors other than tungsten hexafluoride may be used as well in CVD processes, which can also cause fluorine migration.

To raise defense against the diffusion of fluorine atoms and/or ions, dielectric film 134 can include high-k dielectric materials including, but not limited to, silicon nitride, aluminum oxide ($Al_2O_3$), hafnium oxide ($HfO_2$) tantalum oxide ($Ta_2O_5$), zirconium oxide ($ZrO_2$), titanium oxide ($TiO_2$), or any combination thereof. In some embodiments, high-k dielectric materials include any dielectrics having a dielectric constant, or k-value, higher than that of silicon nitride (k>7). In some embodiments, high-k dielectric materials include any dielectrics having a dielectric constant, or k-value, higher than that of silicon oxide (k>3.9). Dielectric film 134 and gate dielectric layer 116 include the same high-k dielectric material, such as aluminum oxide, according to some embodiments. It is understood that in some embodiments, dielectric film 134 includes a dielectric material different from gate dielectric layer 116.

Dielectric film 134 can have a thickness (in the lateral direction) between about 1 nm and about 10 nm, such as between 1 nm and 10 nm. In some embodiments, the thickness of dielectric film 134 is between about 3 nm and about 7 nm, such as between 3 nm and 7 nm (e.g., 3 nm, 3.5 nm, 4 nm, 4.5 nm, 5 nm, 5.5 nm, 6 nm, 6.5 nm, 7 nm, any range bounded by the lower end by any of these values, or in any range defined by any two of these values). This can ensure chance of direct tunneling by electrons through the dielectric film becomes negligible. Dielectric film 134 can also reduce the chance of trap-assisted tunneling. For example, hydrogen atoms or ions can be more easily trapped in silicon oxide rather than in high-k dielectric materials, such as aluminum oxide, forcing the leakage current to increase. Overall, the leakage current through composite spacer 128 can be further reduced by including dielectric film 134.

In some embodiments, dielectric film 134 includes a plurality of dielectric sub-films stacked laterally. That is, dielectric film 134 can be a composite dielectric film including a plurality of dielectric materials. In some embodiments, each dielectric sub-film includes different dielectric materials, such as different high-k dielectric materials. In some embodiments, at least some of the dielectric sub-films include the same dielectric material, such as the same high-k dielectric material. The thickness ranges described above may refer to the total thickness of a composite dielectric film.

In some embodiments, slit contact 126 functions as the contact of the ACS shared by NAND memory strings 104 in the same memory block or the same memory finger. Slit contact 126 can thus be referred to as a "common source contact" of multiple NAND memory strings 104. In some embodiments, substrate 102 includes a doped region 136 (including p-type or n-type dopants at a desired doping level), and the lower end of slit contact 126 is in contact with doped region 136 in substrate 102. Slit contact 126 thus can electrically connect to the ACS of NAND memory strings 104 through doped region 136. In some embodiments, both conductor layers 107 (the gate conductors) and slit contacts 126 (common source contacts) include the same conductive material, such as tungsten.

Figure 2:
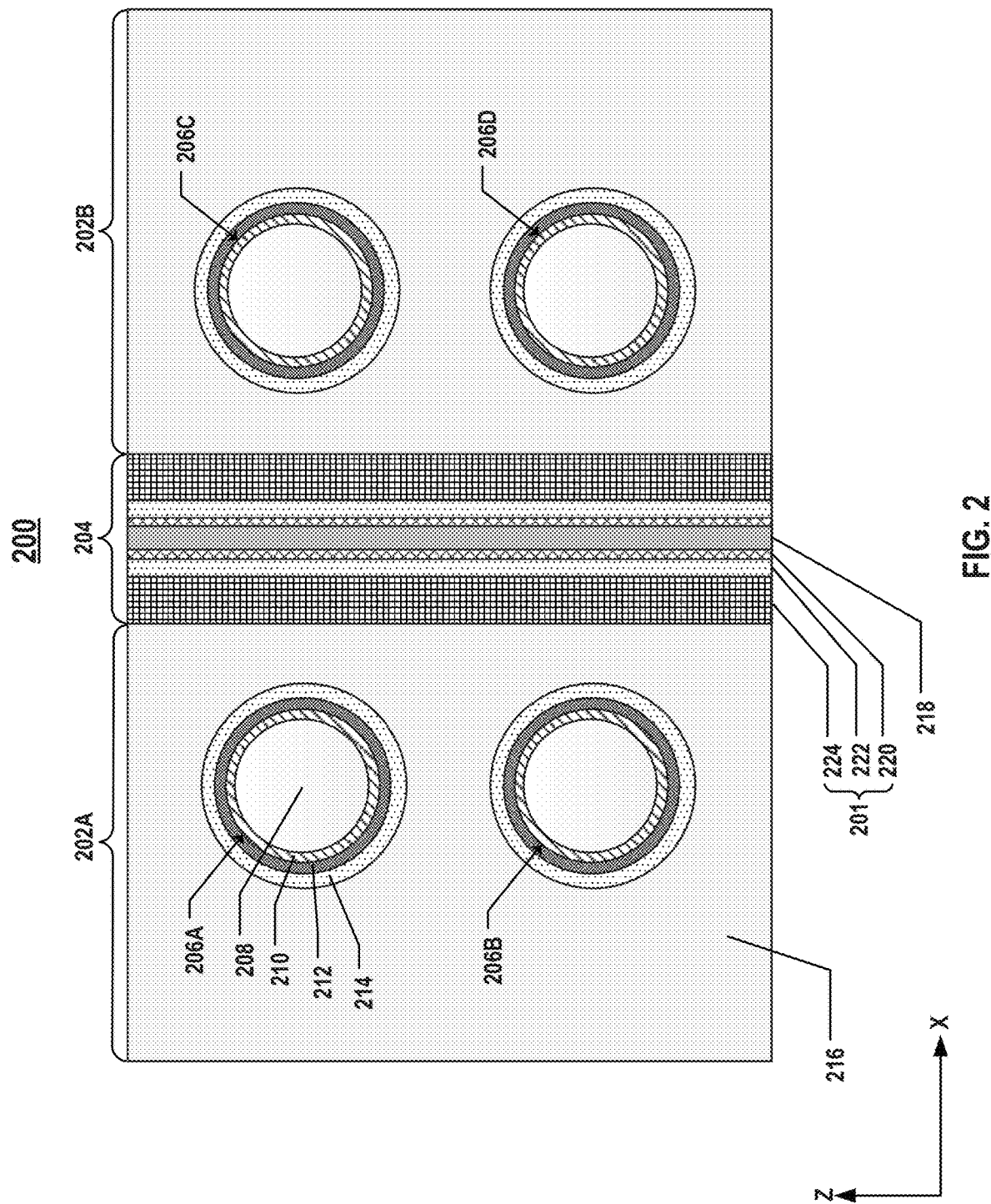
FIG. 2 illustrates a plan view of an exemplary 3D memory device with a corrosion-resistant composite spacer, according to some embodiments of the present disclosure.

FIG. 2 illustrates a plan view of an exemplary 3D memory device 200 with a corrosion-resistant composite spacer 201, according to some embodiments of the present disclosure. 3D memory device 200 can be constructed based on the cross-section line A-A in FIG. 1. It is noted that x and z axes are included in FIG. 2 to further illustrate the spatial relationship of the components in 3D memory device 200. As shown in FIG. 2, 3D memory device 200 includes NAND memory cell stacks 202A and 202B, each of which is disposed on the opposite side of a slit structure 204. Each NAND memory cell stack 202A or 202B further includes two NAND memory strings, making up a total of four NAND memory strings 206A, 206B, 206C, and 206D in 3D memory device 200, as shown in FIG. 2. Since their structures are all identical, only NAND memory string 206A is used to describe its structures in detail. NAND memory string 206A can include a nominally round-shaped semiconductor channel 208 cladded by a memory film 210. NAND memory string 206A can be further surrounded by a gate dielectric layer 212 and a glue layer 214. A conductor layer 216 can fill the rectangular plane outside of the aforementioned structures to serve as the gate conductors of the memory cells in NAND memory cell stack 202A. That is, semiconductor channel 208, memory film 210, gate dielectric layer 212, glue layer 214, and conductor layer 216 are arranged radially from the center of NAND memory string 206A in this order, according to some embodiments.

Slit structure 204 can span across the entire substrate in the z-direction, separating NAND memory strings 206A, 206B, 206C, and 206D into two memory blocks as shown in FIG. 2. In some embodiments, slit structure 204 is symmetrical about the z-axis and includes a slit contact 218, a second silicon oxide film 220, a dielectric film 222, and a first silicon oxide film 224, if counting the components from inside out. As shown in FIG. 2, if the insulation between conductor layer 216 and slit contact 218 is degraded by encroachment of fluorine atoms and/or ions, the leakage current across the insulation layers may increase. Conductor layer 216 may even become short-circuited to slit contact 218, destroying the entire memory block. To prevent fluorine migration and the resulting leakage, first silicon oxide film 224, dielectric film 222, and second silicon oxide film 220 can form corrosion-resistant composite spacer 201 electrically insulating slit contact 218 and NAND memory cell stack 202A or 202B (and components therein, e.g., conductor layer 216 and NAND memory string 206A). Slit contact 218 can be disposed laterally between NAND memory cell stack 202A (including NAND memory strings 206A and 206B) and NAND memory cell stack 202B (including NAND memory strings 206C and 206D). Composite spacer 201 can be disposed laterally between slit contact 218 and NAND memory cell stack 202A (including NAND memory strings 206A and 206B) or disposed laterally between slit contact 218 and NAND memory cell stack 202B (including NAND memory strings 206C and 206D). As shown in FIG. 2, slit structure 204 (and slit contact 218 and composite spacer 201 therein) is in a nominally stripe shape in the plan view. The components of 3D memory device 200 described above can share the same dimensions and materials as described above with respect to 3D memory device 100 and thus, will not be repeated in detail.

It is understood that using a composite spacer to protect a contact layer from leakage current caused by fluorine migration from an adjacent conductor layer can be implemented into various semiconductor structures. In some embodiments, the use of a composite spacer can be expanded to a generic semiconductor device. Moreover, the conductor layer can be in any forms including lateral interconnect lines and vertical interconnect access (via) contacts, so long as fluorine ions and/or atoms are present in the conductor layer as a result of the fabrication process. In some embodiments, the contact layer can be in the shape of a pillar or in any other shapes, as long as the composite spacer can be adequately formed around the contact layer.

Figure 3:
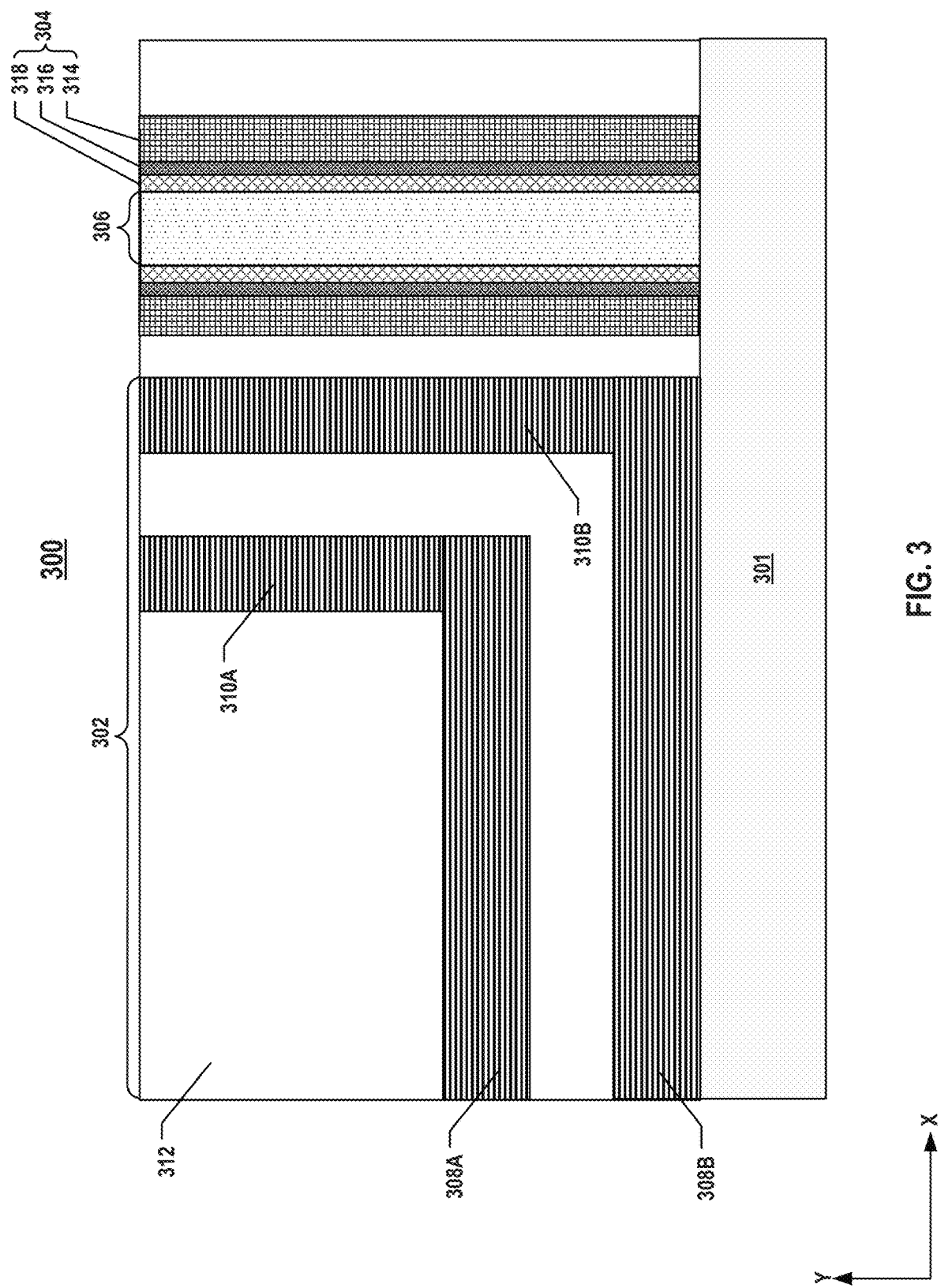
FIG. 3 illustrates a cross-section of an exemplary semiconductor device with a corrosion-resistant composite spacer, according to some embodiments of the present disclosure.

For example, FIG. 3 illustrates a cross-section of an exemplary semiconductor device 300 with a corrosion-resistant composite spacer 304, according to some embodiments of the present disclosure. Semiconductor device 300 can be any suitable logic or memory devices. Semiconductor device 300 includes a conductor layer 302, composite spacer 304, and a contact layer 306 each disposed on a substrate 301, according to some embodiments. Conductor layer 302 can further include interconnect lines 308A and 308B, as well as via contacts 310A and 310B formed in one or more interlayer dielectric (ILD) layers 312 (also known as "intermetal dielectric (IMD) layers"). Conductor layer 302 can be made from conductive materials, such as tungsten, formed by fluorine-based precursors. Contact layer 306 can be a via contact with a circular cross-section. Contact layer 306 can include conductive materials including, but not limited to, W, Co, Cu, Al, polysilicon, doped silicon, silicides, or any combination thereof. Composite spacer 304 can include a low-temperature silicon oxide film 314, a high-k dielectric film 316, and a high-temperature silicon oxide film 318 stacked laterally between conductor layer 302 and contact layer 306. The materials and dimensions of composite spacer 304 can be the same as those of composite spacer 128 in 3D memory device 100. With high-k dielectric film 316 being part of composite spacer 304, electrical insulation between conductor layer 306 and via contact 310B can be greatly enhanced, and the damage to high-temperature silicon oxide film 318 caused by fluorine atoms and/or ions can be greatly reduced.

Figure 4A:
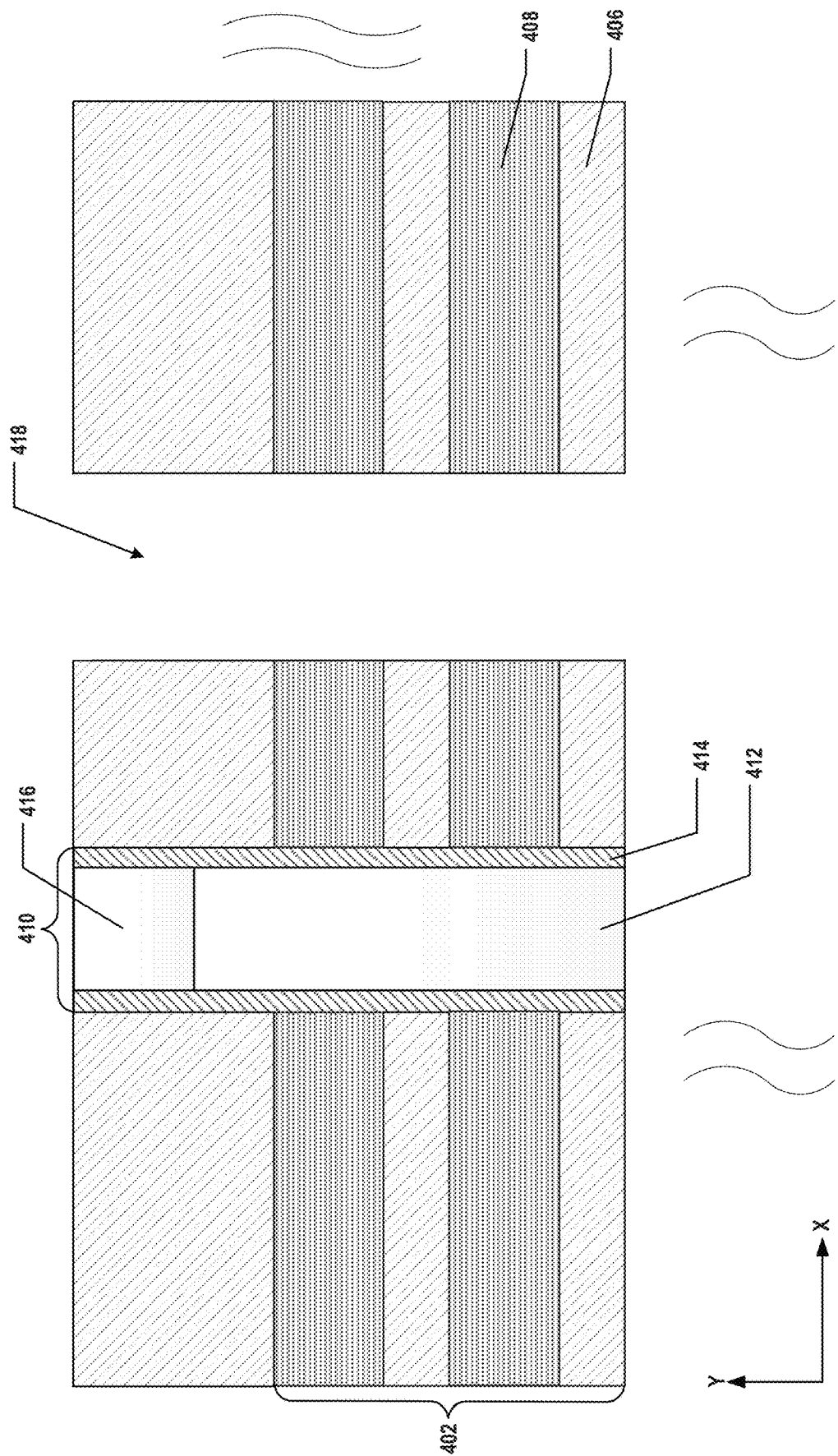
FIGS. 4A-4F illustrate an exemplary fabrication process for forming a 3D memory device with a corrosion-resistant composite spacer, according to some embodiments of the present disclosure.
Figure 5:
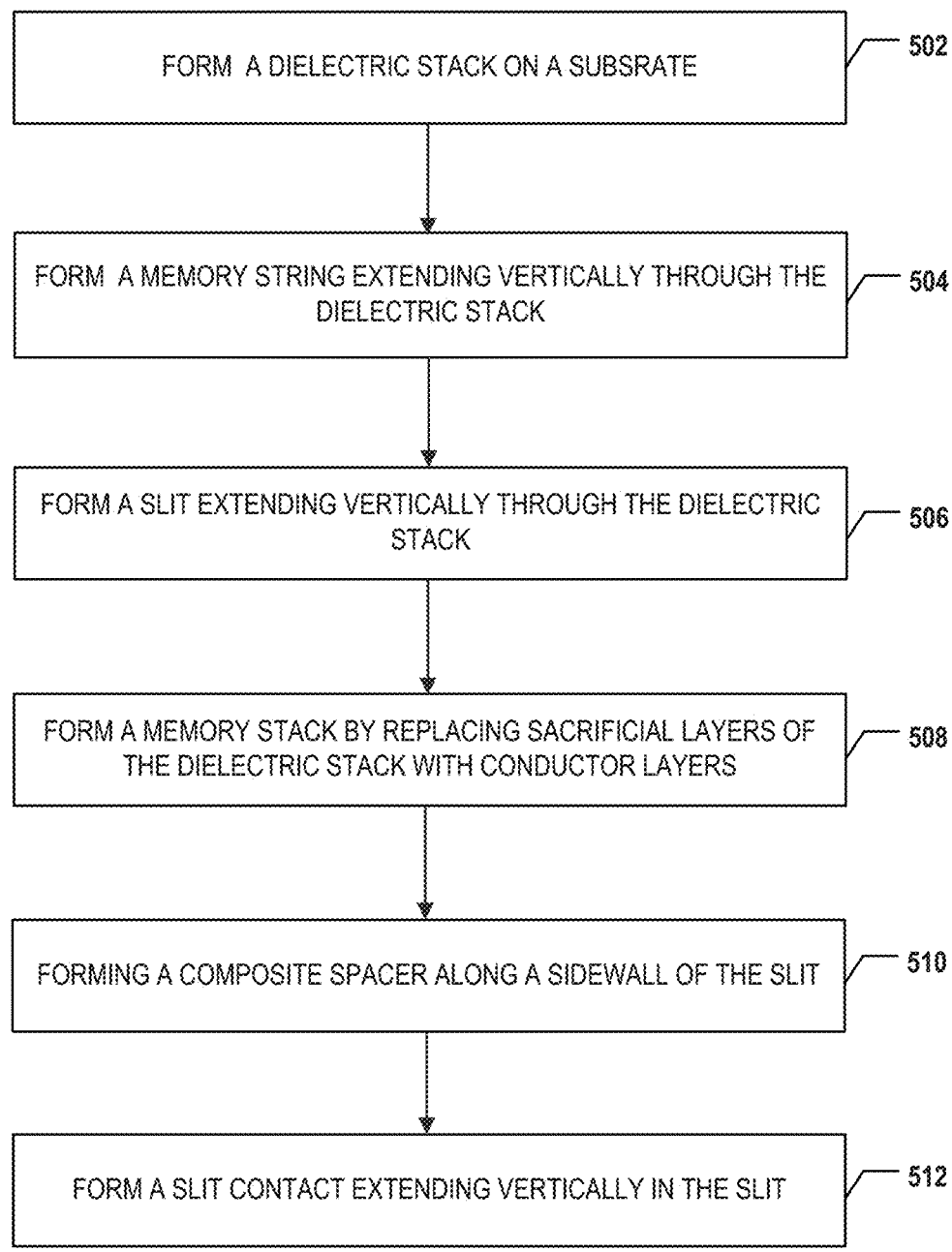
FIG. 5 is a flowchart of an exemplary method for forming a 3D memory device with a corrosion-resistant composite spacer, according to some embodiments of the present disclosure.
Figure 6:
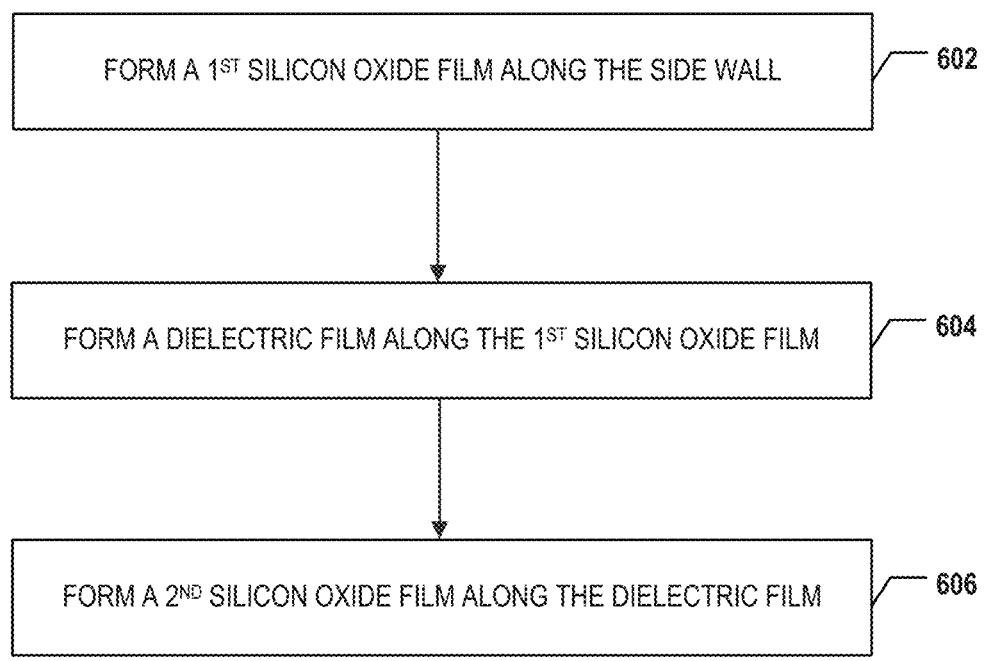
FIG. 6 is a flowchart of an exemplary method for forming a corrosion-resistant composite spacer, according to some embodiments of the present disclosure.

FIGS. 4A-4F illustrate an exemplary fabrication process for forming a 3D memory device with a corrosion-resistant composite spacer, according to some embodiments. FIG. 5 is a flowchart of an exemplary method 500 for forming a 3D memory device with a corrosion-resistant composite spacer, according to some embodiments. FIG. 6 is a flowchart of an exemplary method 600 for forming a corrosion-resistant composite spacer, according to some embodiments. Examples of the 3D memory device depicted in FIGS. 4-6 include 3D memory devices 100 and 200 depicted in FIGS. 1-2. FIGS. 4-6 will be described together. It is understood that the operations shown in methods 500 and 600 are not exhaustive and that other operations can be performed as well before, after, or between any of the illustrated operations. Further, some of the operations may be performed simultaneously, or in a different order than shown in FIGS. 5-6.

Referring to FIG. 5, method 500 starts at operation 502, in which a dielectric stack is formed on a substrate. The substrate can be a silicon substrate. The dielectric stack can include a plurality of dielectric/sacrificial layer pairs. As illustrated in FIG. 4A, the top portion of a dielectric stack 402 is given in a close-up view. Pairs of a first dielectric layer 406 and a second dielectric layer (known as a "sacrificial layer") 408 (together referred to herein as "dielectric layer pairs") are formed on a substrate (not shown). Dielectric layers 406 and sacrificial layers 408 can be alternatively deposited on the substrate to form dielectric stack 402. In some embodiments, each dielectric layer 406 includes a layer of silicon oxide, and each sacrificial layer 408 includes silicon nitride. Dielectric stack 402 can be formed by one or more thin film deposition processes including, but not limited to, CVD, PVD, ALD, or any combination thereof.

Method 500 proceeds to operation 504, as illustrated in FIG. 5, in which a memory string extending vertically through the dielectric stack is formed. As illustrated in FIG. 4A, a memory string 410 is formed extending vertically through dielectric stack 402. In some embodiments, fabrication processes to form memory string 410 further include forming a channel hole that extends vertically through dielectric stack 402 by, for example, wet etching and/or dry etching. In some embodiments, fabrication processes to form memory string 410 further include forming a semiconductor channel 412 and a memory film 414 disposed laterally between semiconductor channel 412 and the dielectric layer pairs of dielectric stack 402. Semiconductor channel 412 can include semiconductor materials, such as polysilicon. Memory film 414 can be a composite dielectric layer, such as a combination of a tunneling layer, a storage layer, and a blocking layer. Each layer in memory film 414 can include dielectric materials including, but not limited to, silicon oxide, silicon nitride, silicon oxynitride, or any combination thereof. Semiconductor channel 412 and memory film 414 can be formed by one or more thin film deposition processes, such as ALD, CVD, PVD, any other suitable processes, or any combination thereof.

In some embodiments, a semiconductor plug 416 is formed at the upper end of memory string 410. At first, a recess can be formed at the upper end of memory string 410. Semiconductor plug 416 can be formed by filling the recess using one or more thin film deposition processes, such as ALD, CVD, PVD, any other suitable processes, or any combination thereof. In some embodiments, polysilicon is deposited to fill the recess, followed by a CMP process to remove excess polysilicon. In some embodiments, a composite metal layer, such as Ti/TiN/W is deposited to fill the recess, followed by a CMP process to remove excess metal layers.

Method 500 proceeds to operation 506, as illustrated in FIG. 5, in which a slit extending vertically through the dielectric stack is formed. The slit can be part of a slit structure, such as a GLS. As illustrated in FIG. 4A, a slit 418 is formed extending vertically through dielectric stack 402. Slit 418 can be first formed by wet etching and/or dry etching of dielectrics (e.g., silicon oxide and silicon nitride) through dielectric stack 402. In some embodiments, doped regions (e.g., doped regions 136 in FIG. 1) are then formed in the substrate under each slit 418 by, for example, ion implantation and/or thermal diffusion through slits 418. It is understood that doped regions can be formed in an earlier fabrication stage, for example, prior to the formation of slits 418, according to some embodiments.

Method 500 proceeds to operation 508, as illustrated in FIG. 5, in which a memory stack is formed on the substrate by replacing, with a plurality of conductor layers, sacrificial layers in the dielectric/sacrificial layer pairs. The memory stack thus includes a plurality of conductor/dielectric layer pairs. In some embodiments, forming the memory stack includes etching the sacrificial layers in the dielectric/sacrificial layer pairs through the slit, and depositing the conductor layers in the conductor/dielectric layer pairs through the slit. The deposition of the conductor layers can use a precursor containing fluorine. For example, the conductor layers include tungsten, and the precursor includes tungsten hexafluoride. In some embodiments, a gate dielectric layer is deposited in each conductor/dielectric layer pair prior to depositing the conductor layers.

Figure 4B:
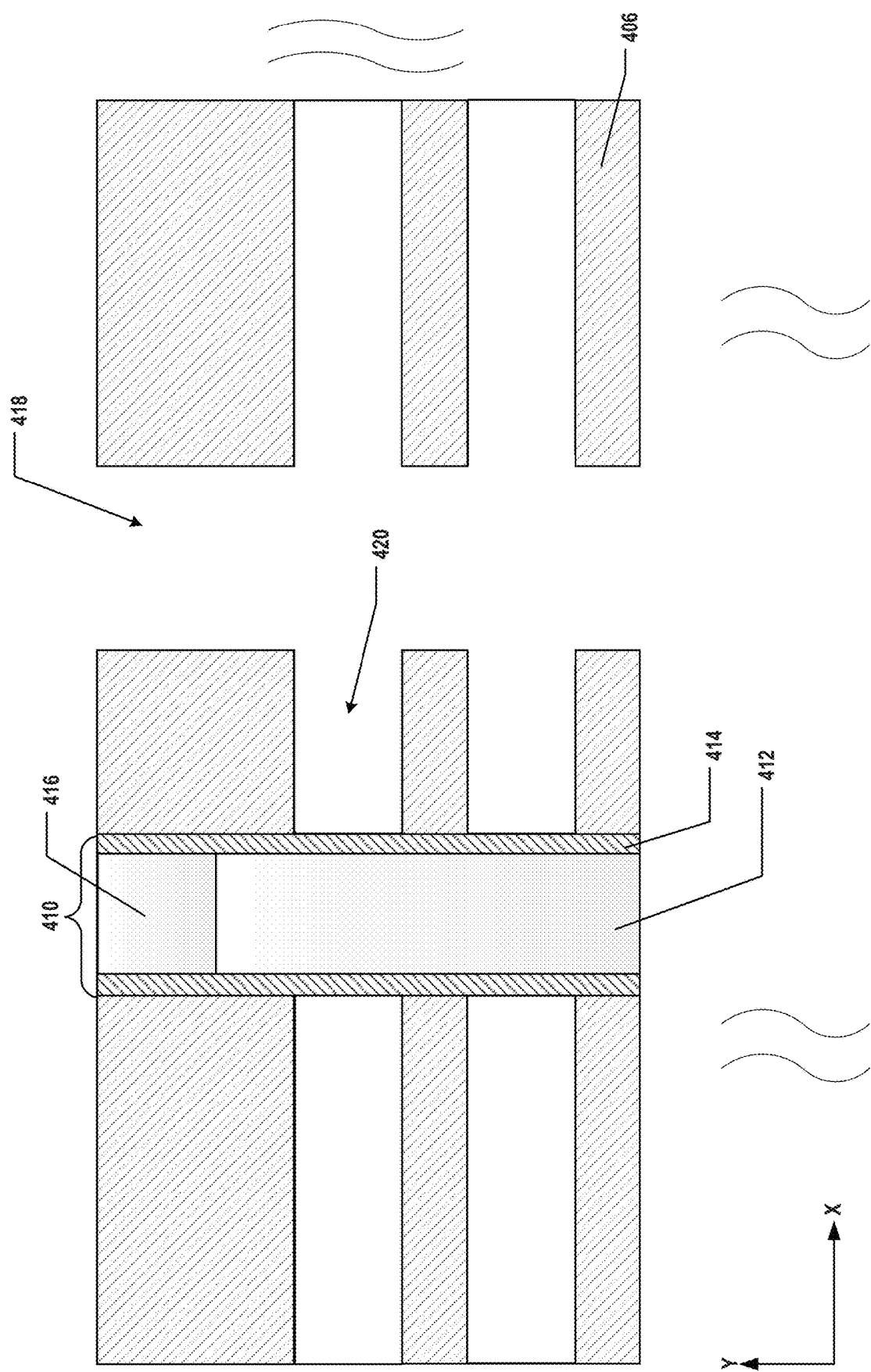

As illustrated in FIG. 4B, sacrificial layers 408 (as shown in FIG. 4A) in dielectric stack 402 are removed by wet etching and/or dry etching selective to dielectric layers 406. Lateral recesses 420 connected to slit 418 can be formed after sacrificial layers 408 are completely etched out. In some embodiments, the etching process is facilitated by exposing slit 418 to hot phosphoric acid by which silicon nitride is etched preferentially over silicon oxide.

Figure 4C:
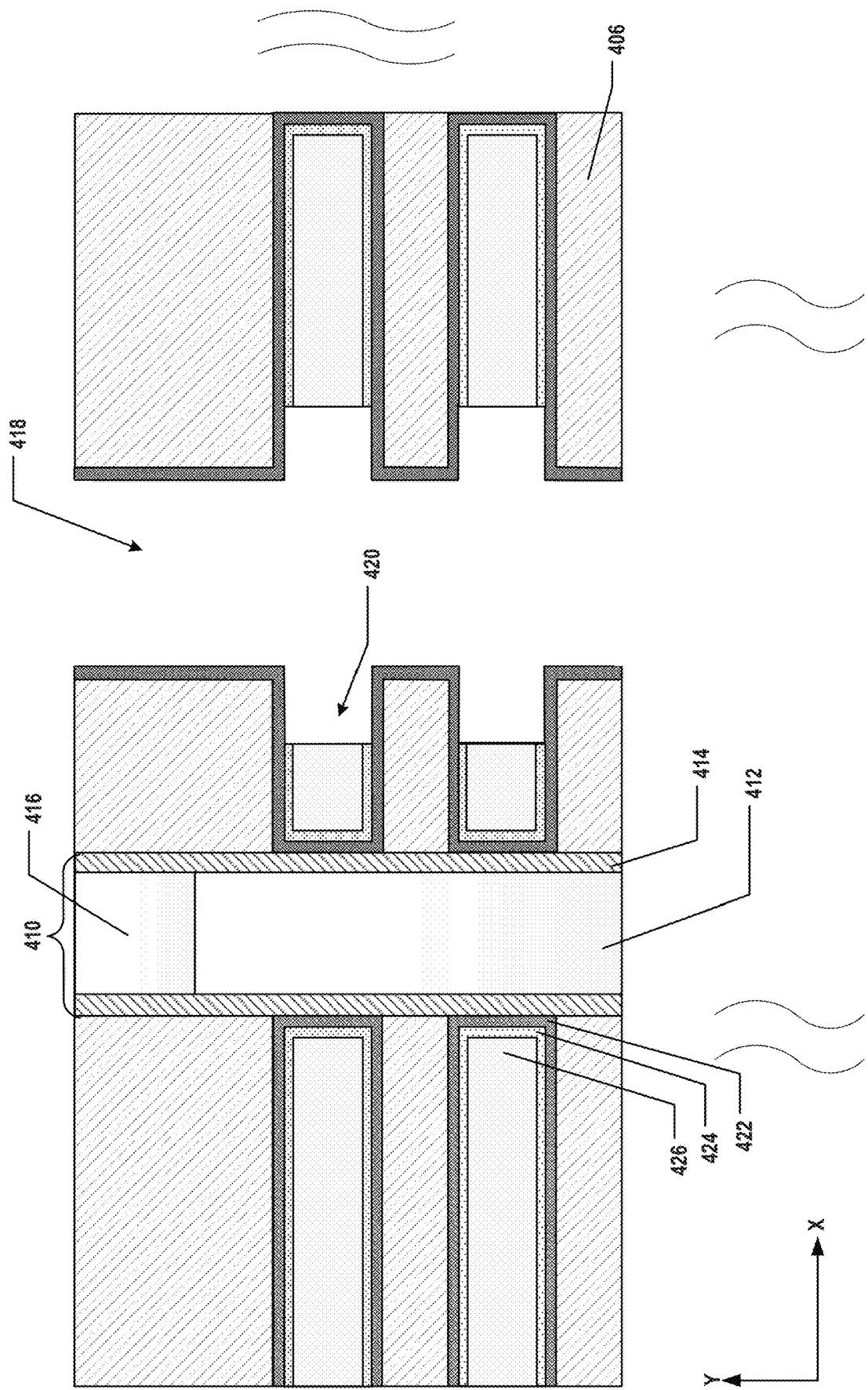

As shown in FIG. 4C, a gate dielectric layer 422, a glue layer 424, and a conductor layer 426 (gate conductor) are formed subsequently in this order along the sidewalls of slit 418 and lateral recesses 420. In some embodiments, gate dielectric layer 422 is first deposited along the sidewalls of slit 418 and lateral recesses 420, followed by the deposition of glue layer 424 along gate dielectric layer 422. Conductor layer 426 then can be deposited along glue layer 424. Glue layer 424 and conductor layer 426 are then partially removed by wet etching and/or dry etching, according to some embodiments. FIG. 4C illustrates the fabrication processes of forming control gates of NAND memory cells, which are known as the gate replacement or word line replacement process.

Gate dielectric layer 422, glue layer 424, and conductor layer 426 can be formed by one or more thin film deposition processes, such as ALD, CVD, PVD, any other suitable processes, or any combination thereof. Gate dielectric layer 422 can include dielectric materials including silicon nitride, high-k dielectrics, such as aluminum oxide ($Al_2O_3$), hafnium oxide ($HfO_2$) or tantalum oxide ($Ta_2O_5$), or any combination thereof. Glue layer 424 can include thin film materials including, but not limited to, titanium (Ti), titanium nitride (TiN), tantalum (Ta), tantalum nitride (TaN), or any combination thereof. Conductor layer 426 can include conductive materials including, not limited to, W, Co, Cu, Al, polysilicon, silicides, or any combination thereof. In some embodiments, gate dielectric layer 422, glue layer 424, and conductor layer 426 are each formed by CVD processes in which the reaction gases (including precursors) pass through slit 418 to lateral recesses 420 and are reacted and deposited along the sidewalls of slit 418 and lateral recesses 420. In some embodiments, the CVD process for depositing conductor layers 426 uses a precursor containing fluorine. For example, conductor layer 426 includes tungsten and the precursor used in the CVD process includes tungsten hexafluoride.

Method 500 proceeds to operation 510, as illustrated in FIG. 5, in which a composite spacer is formed along a sidewall of the slit. The composite spacer can include a first silicon oxide film, a second silicon oxide film, and a dielectric film formed laterally between the first silicon oxide film and the second silicon oxide film. Referring to FIG. 6, an exemplary method 600 for forming a composite spacer is disclosed. Method 600 starts at operation 602, in which the first silicon oxide film is formed along the sidewall of the slit. In some embodiments, the formation of the first silicon oxide film is at a first temperature not higher than 400° C.

Figure 4D:
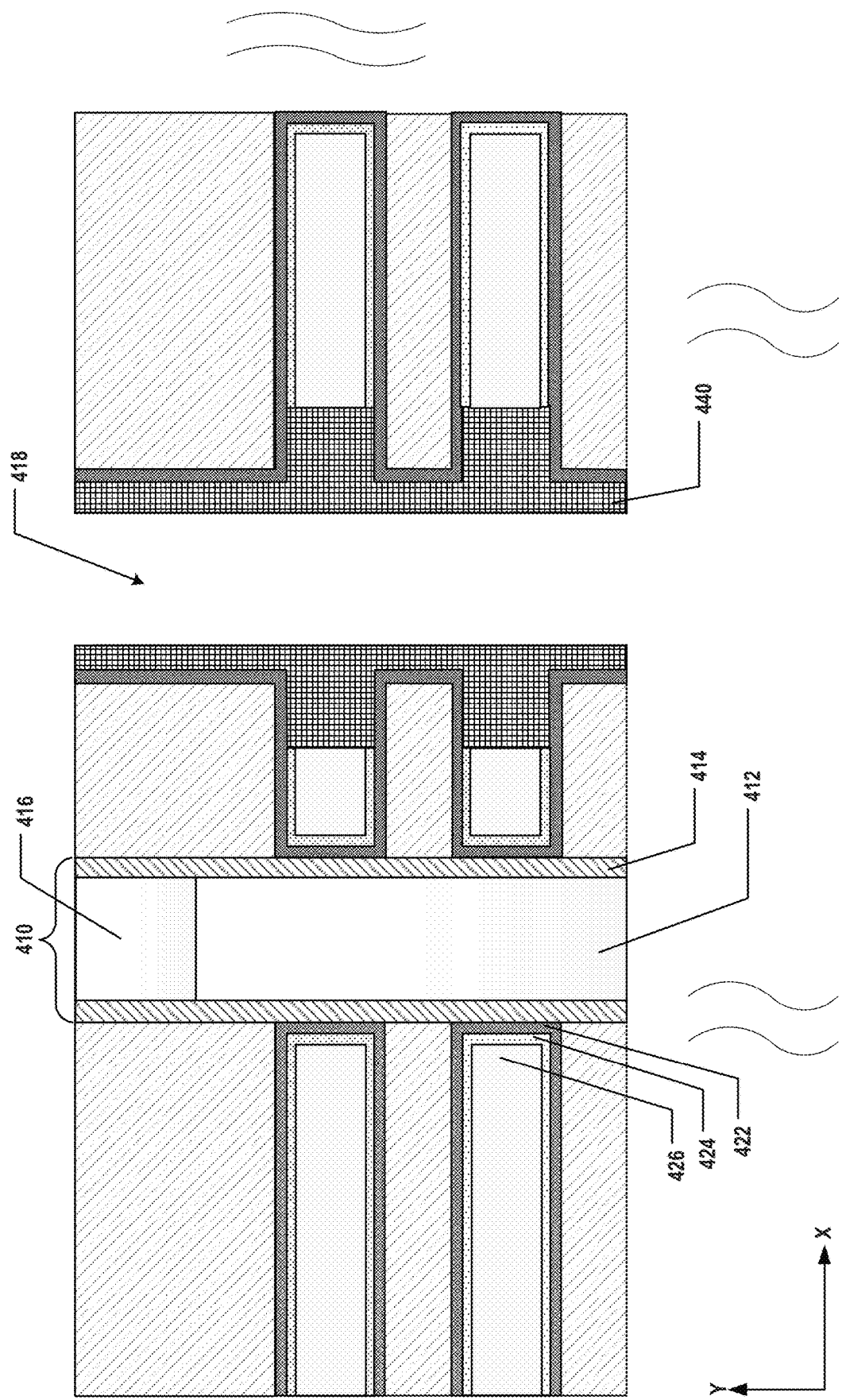

As illustrated in FIG. 4D, a first silicon oxide film 440 is formed by filling (e.g., depositing) silicon oxide along the sidewall of slit 418 (and the remaining space of lateral recesses 420) by PVD, CVD, ALD, any other suitable process, or any combination thereof. In some embodiments, first silicon oxide film 440 includes low-temperature silicon oxide formed under the process temperature not higher than 400° C., which is a cautionary measure to prevent conductor layers 426 from severe oxidation. In some embodiments, the process temperature for forming first silicon oxide film 440 is not higher than 600° C. For example, the process for forming the low-temperature silicon oxide includes, but not limited to, LT CVD or LT ALD.

Method 600 proceeds to operation 604, as illustrated in FIG. 6, in which a dielectric film is formed along the first silicon oxide film. The dielectric film can include a high-k dielectric material, such as aluminum oxide. In some embodiments, the thickness of the dielectric film is between about 1 nm and about 10 nm, such as between about 3 nm and about 7 nm.

Figure 4E:
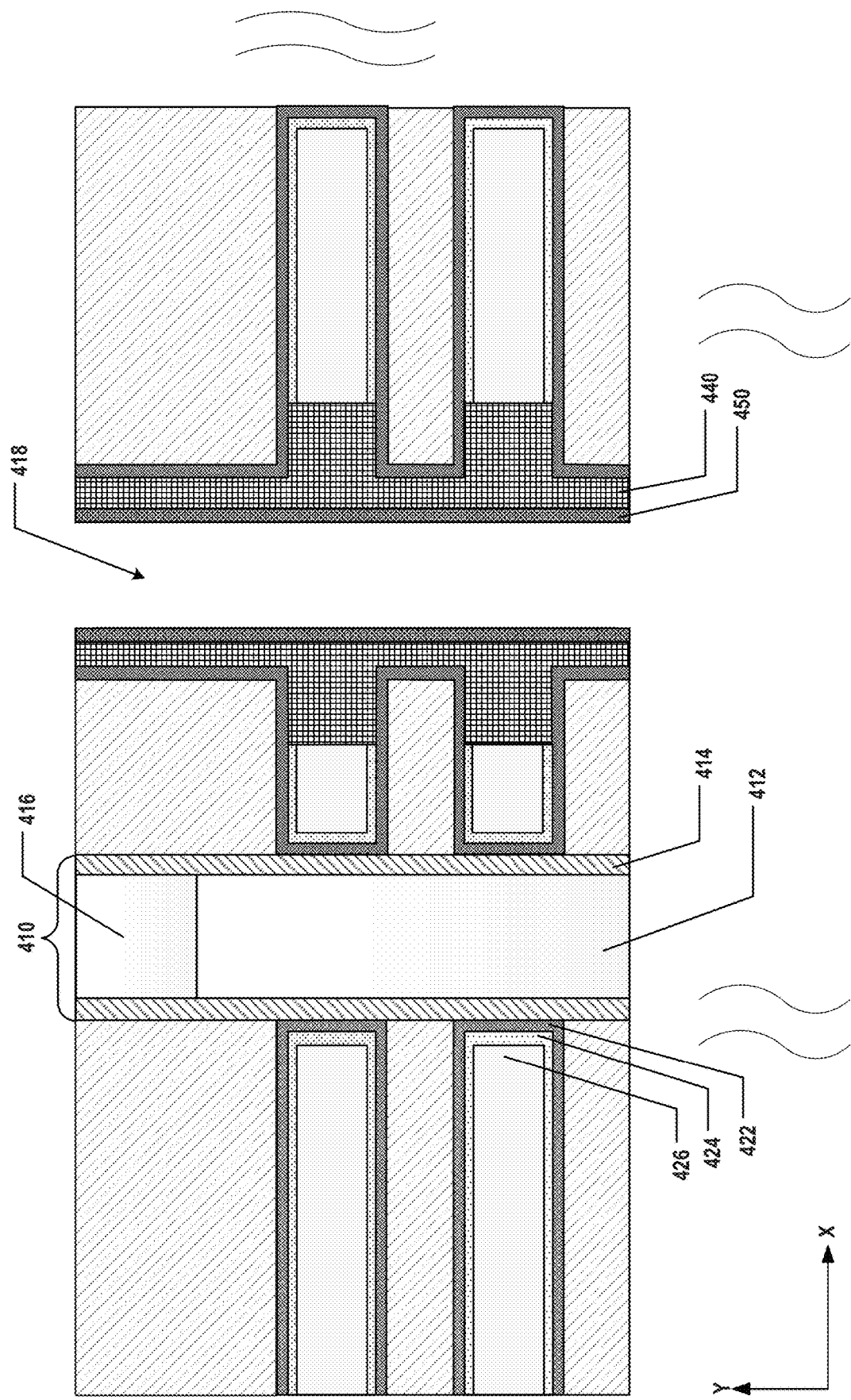

As illustrated in FIG. 4E, a dielectric film 450 is formed by filling (e.g., depositing) dielectric materials along first silicon oxide film 440 through slit 418 by PVD, CVD, ALD, any other suitable process, or any combination thereof. Dielectric film 450 can act as a cladding layer covering first silicon oxide film 440. Dielectric film 450 can include high-k dielectric materials including, but not limited to, aluminum oxide ($Al_2O_3$), hafnium oxide ($HfO_2$) tantalum oxide ($Ta_2O_5$), zirconium oxide ($ZrO_2$), titanium oxide ($TiO_2$), or any combination thereof. In some embodiments, dielectric film 450 is made from aluminum oxide, which is known to be more corrosion-resistant to fluorine ions and atoms than silicon oxide. The thickness (in the lateral direction) of dielectric film 450 can be formed between about 1 nm and about 10 nm, such as between 1 nm and 10 nm. In some embodiments, the thickness of dielectric film 450 is between about 3 nm and about 7 nm, such as between 3 nm and 7 nm (e.g., 3 nm, 3.5 nm, 4 nm, 4.5 nm, 5 nm, 5.5 nm, 6 nm, 6.5 nm, 7 nm, any range bounded by the lower end by any of these values, or in any range defined by any two of these values).

Method 600 proceeds to operation 606, as illustrated in FIG. 6, in which a second silicon oxide film is formed along the dielectric film. In some embodiments, the formation of the second silicon oxide film is at a second temperature higher than the first temperature used for forming the first silicon oxide film, such as not lower than 400° C.

Figure 4F:
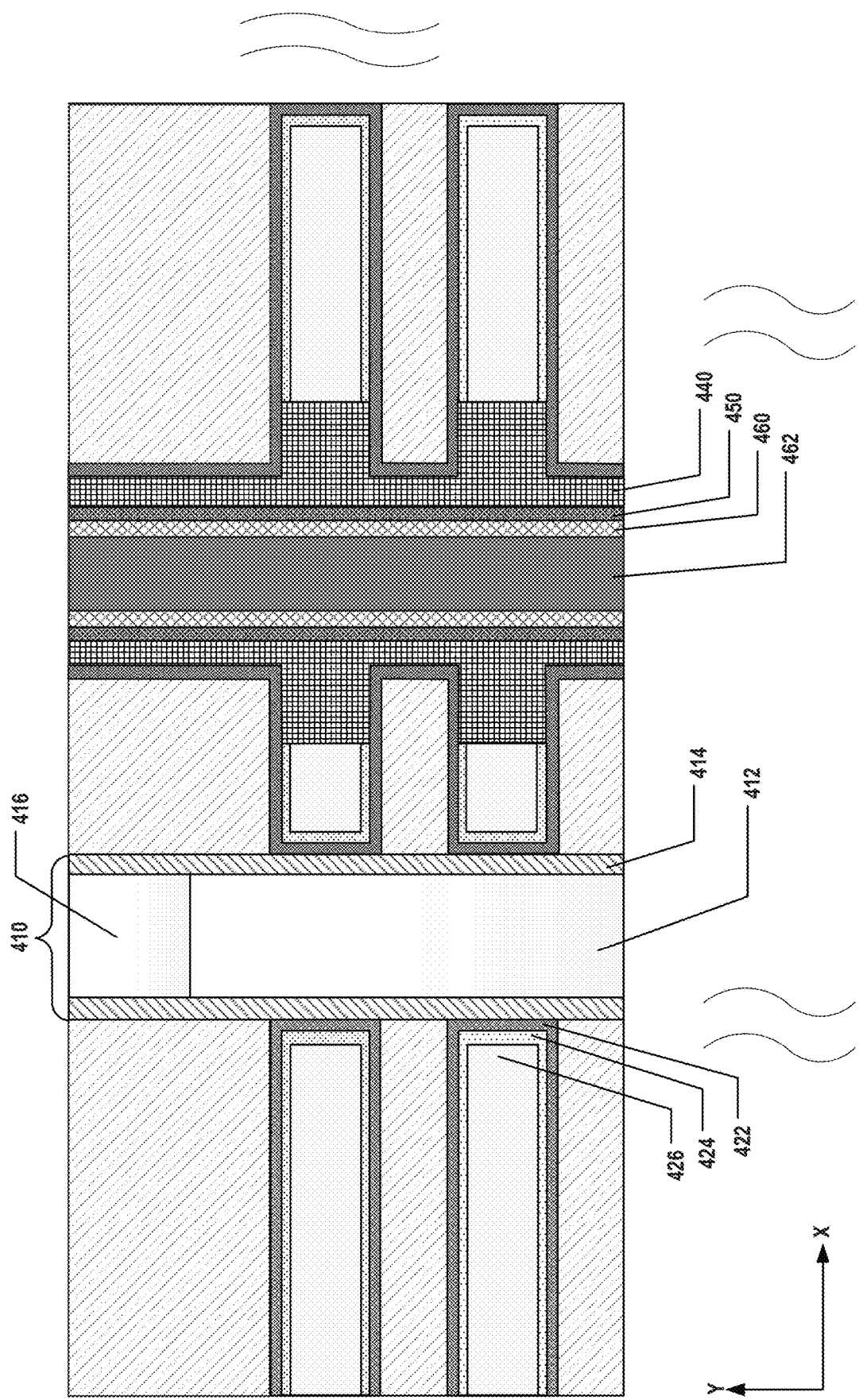

As illustrated in FIG. 4F, a second silicon oxide film 460 is formed by filling (e.g., depositing) silicon oxide along dielectric film 450 by PVD, CVD, ALD, any other suitable process, or any combination thereof. Second silicon oxide film 460 can act as a cladding layer covering dielectric film 450. In some embodiments, second silicon oxide film 460 includes high-temperature silicon oxide formed under the process temperature not lower than 400° C., which is a measure to increase the oxide film quality leading to better insulation resistance in second silicon oxide film 460. In some embodiments, the process temperature for forming second silicon oxide film 460 is not lower than 600° C. For example, the process for forming the high-temperature silicon oxide includes, but not limited to, thermal oxidation.

It should be noted that the first silicon oxide film, the dielectric film, and the second silicon oxide film can be collectively referred as a composite spacer so as to emphasize its unique structures. It is also understood that the fabrication process of a composite spacer can be applied to any other types of semiconductor devices to obtain greater electrical insulation between two conductor layers, provided that at least one of them containing residue of fluorine atoms and/or ions. The use of composite spacer in semiconductor devices can thus improve reliability of the devices with little cost.

Referring back to FIG. 5, method 500 proceeds to operation 512, as illustrated in FIG. 5, in which a slit contact extending vertically in the slit is formed. As illustrated in FIG. 4F, a slit contact 462 is formed by filling (e.g., depositing) conductive materials into the remaining space of slit 418 by PVD, CVD, ALD, any other suitable process, or any combination thereof. Slit contact 462 serves as a common source contact, according to some embodiments. In some embodiments, slit contact 462 includes conductive materials including, not limited to, W, Co, Cu, Al, polysilicon, silicides, or any combination thereof. In one example, slit contact 462 is made from tungsten.

According to one aspect of the present disclosure, a 3D memory device includes a substrate, a memory stack disposed on the substrate and including a plurality of conductor/dielectric layer pairs, a plurality of memory strings each extending vertically through the memory stack, a slit contact disposed laterally between the plurality of memory strings, and a composite spacer disposed laterally between the slit contact and at least one of the memory strings. The composite spacer includes a first silicon oxide film, a second silicon oxide film, and a dielectric film disposed laterally between the first silicon oxide film and the second silicon oxide film.

In some embodiments, the dielectric film comprises a high-k dielectric material. The high-k dielectric material includes aluminum oxide, according to some embodiments. In some embodiments, a thickness of the dielectric film is between about 1 nm and about 10 nm. The thickness of the dielectric film is between about 3 nm and about 7 nm, according to some embodiments.

In some embodiments, the first silicon oxide film includes a low-temperature silicon oxide film, and the second silicon oxide film includes a high-temperature silicon oxide film. The low-temperature silicon oxide film is disposed laterally between the at least one of the memory strings and the dielectric film, and the high-temperature silicon oxide film is disposed laterally between the dielectric film and the slit contact, according to some embodiments.

In some embodiments, the dielectric film includes a plurality of dielectric sub-films stacked laterally. The plurality of dielectric sub-films include a plurality of dielectric materials.

In some embodiments, each of the conductor/dielectric layer pairs includes a conductor layer including tungsten. The slit contact includes tungsten, according to some embodiments.

In some embodiments, each of the memory strings includes a semiconductor channel extending vertically through the conductor/dielectric layer pairs, and a memory film disposed laterally between the conductor/dielectric layer pairs and the semiconductor channel.

In some embodiments, each of the slit contact and the composite spacer is in a nominally stripe shape in a plan view.

In some embodiments, the slit contact is electrically connected to sources of at least two of the memory strings.

According to another aspect of the present disclosure, a semiconductor device includes a substrate, a conductor layer disposed above the substrate, a contact extending vertically through the conductor layer, and a composite spacer disposed laterally between the contact and the conductor layer. The composite spacer includes a low-temperature silicon oxide film, a high-temperature silicon oxide film, and a high-k dielectric film disposed laterally between the low-temperature silicon oxide film and the high-temperature silicon oxide film.

In some embodiments, the high-k dielectric film includes aluminum oxide. In some embodiments, a thickness of the dielectric film is between about 1 nm and about 10 nm. The thickness of the dielectric film is between about 3 nm and about 7 nm, according to some embodiments.

In some embodiments, the low-temperature silicon oxide film is disposed laterally between the conductor layer and the high-k dielectric film, and the high-temperature silicon oxide film is disposed laterally between the high-k dielectric film and the contact.

In some embodiments, the high-k dielectric film includes a plurality of high-k dielectric sub-films stacked laterally. The plurality of high-k dielectric sub-films include a plurality of high-k dielectric materials, according to some embodiments.

In some embodiments, the conductor layer includes tungsten. In some embodiments, the contact includes tungsten.

In some embodiments, each of the contact and the composite spacer is in a nominally stripe shape in a plan view.

According to still another aspect of the present disclosure, a method for forming a 3D memory device is disclosed. A dielectric stack including a plurality of dielectric/sacrificial layer pairs is formed on a substrate. A memory string extending vertically through the dielectric stack is formed. A slit extending vertically through the dielectric stack is formed. A memory stack is formed on the substrate including a plurality of conductor/dielectric layer pairs by replacing, with a plurality of conductor layers, the sacrificial layers in the dielectric/sacrificial layer pairs through the slit. A composite spacer is formed along a sidewall of the slit. The composite spacer includes a first silicon oxide film, a second silicon oxide film, and a dielectric film formed laterally between the first silicon oxide film and the second silicon oxide film. A slit contact extending vertically in the slit is formed.

In some embodiments, to form the memory stack, the sacrificial layers in the plurality of dielectric/sacrificial layer pairs are etched through the slit; and the conductor layers in the plurality of conductor/dielectric layer pairs are deposited through the slit.

In some embodiments, a gate dielectric layer is deposited in each conductor/dielectric layer pairs prior to depositing the conductor layers.

In some embodiments, the deposition of the conductor layers uses a precursor containing fluorine. The conductor layers include tungsten, and the precursor includes tungsten hexafluoride, according to some embodiments.

In some embodiments, to form the composite spacer, the first silicon oxide film is formed along the sidewall of the slit; the dielectric film is formed along the first silicon oxide film; and the second silicon oxide film is formed along the dielectric film. The formation of the first silicon oxide film is at a first temperature, and the formation of the second silicon oxide firm is at a second temperature higher than the first temperature, according to some embodiments. In some embodiments, the first temperature is not higher than 400° C., and the second temperature is not lower than 400° C.

In some embodiments, the dielectric film includes a high-k dielectric material. The high-k dielectric material includes aluminum oxide, according to some embodiments. In some embodiments, a thickness of the dielectric film is between about 1 nm and about 10 nm. The thickness of the dielectric film is between about 3 nm and about 7 nm, according to some embodiments.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
   a memory stack comprising a plurality of conductor/dielectric layer pairs;
   a plurality of memory strings each extending vertically through the memory stack;
   a slit contact disposed laterally between the plurality of memory strings; and
   a composite spacer disposed laterally between the slit contact and at least one of the memory strings,
   wherein the composite spacer comprises a high dielectric constant (high-k) dielectric film comprising aluminum oxide, a first silicon oxide film disposed laterally between the slit contact and the high-k dielectric film and formed by a process performed not lower than about 400° C., and a second silicon oxide film disposed laterally between the high-k dielectric film and the at least one of the memory strings and formed by a process performed not higher than about 400° C., wherein the high-k dielectric film comprises a plurality of dielectric sub-films stacked laterally and extending across the plurality of conductor/dielectric layer pairs, and the first silicon oxide film is present in a recessed area of a gate structure formed by a recessed gate conductor, while the second silicon oxide film and the high-k dielectric film are not present in the recessed area of the gate structure.

2. The 3D memory device of claim 1, wherein a thickness of the high-k dielectric film is between about 1 nm and about 10 nm.

3. The 3D memory device of claim 2, wherein the thickness of the high-k dielectric film is between about 3 nm and about 7 nm.

4. The 3D memory device of claim 1, wherein the plurality of dielectric sub-films comprise a plurality of dielectric materials.

5. The 3D memory device of claim 1, wherein each of the conductor/dielectric layer pairs comprises a conductor layer comprising tungsten.

6. The 3D memory device of claim 1, wherein the slit contact comprises tungsten.

7. The 3D memory device of claim 1, wherein each of the memory strings comprises:
 a semiconductor channel extending vertically through the conductor/dielectric layer pairs; and
 a memory film disposed laterally between the conductor/dielectric layer pairs and the semiconductor channel.

8. The 3D memory device of claim 1, wherein each of the slit contact and the composite spacer is in a nominally stripe shape in a plan view.

9. The 3D memory device of claim 1, wherein the slit contact is electrically connected to sources of at least two of the memory strings.

10. A semiconductor device, comprising:
 a memory stack comprising a plurality of conductor/dielectric layer pairs;
 a contact extending vertically through the memory stack; and
 a composite spacer disposed laterally between the contact and conductor layers of the memory stack,
 wherein the composite spacer comprises a first silicon oxide film formed by a process performed not higher than about 600° C., a second silicon oxide film formed by a process performed not lower than about 600° C., and a high dielectric constant (high-k) dielectric film comprising aluminum oxide disposed laterally between the first silicon oxide film and the second silicon oxide film, wherein the first silicon oxide film is present in a recessed area of a gate structure formed by a recessed gate conductor, while the second silicon oxide film and the high-k dielectric film are not present in the recessed area of the gate structure.

11. A three-dimensional (3D) memory device, comprising:
 a memory stack comprising a plurality of conductor/dielectric layer pairs;
 a plurality of memory strings each extending vertically through the memory stack;
 a slit contact disposed laterally between the plurality of memory strings; and
 a composite spacer disposed laterally between the slit contact and at least one of the memory strings,
 wherein the composite spacer comprises a high dielectric constant (high-k) dielectric film comprising aluminum oxide, a first silicon oxide film disposed laterally between the slit contact and the high-k dielectric film and formed by a process performed not lower than about 600° C., and a second silicon oxide film disposed laterally between the high-k dielectric film and the at least one of the memory strings and formed by a process performed not higher than about 400° C., wherein the high-k dielectric film comprises a plurality of dielectric sub-films stacked laterally and extending across the plurality of conductor/dielectric layer pairs, and the first silicon oxide film is present in a recessed area of a gate structure formed by a recessed gate conductor, while the second silicon oxide film and the high-k dielectric film are not present in the recessed area of the gate structure.

12. The 3D memory device of claim 11, wherein a thickness of the high-k dielectric film is between about 1 nm and about 10 nm.

13. The 3D memory device of claim 12, wherein the thickness of the high-k dielectric film is between about 3 nm and about 7 nm.

14. The 3D memory device of claim 11, wherein the plurality of dielectric sub-films comprise a plurality of dielectric materials.

15. The 3D memory device of claim 11, wherein each of the conductor/dielectric layer pairs comprises a conductor layer comprising tungsten.

16. The 3D memory device of claim 11, wherein the slit contact comprises tungsten.

17. The 3D memory device of claim 11, wherein each of the memory strings comprises:
 a semiconductor channel extending vertically through the conductor/dielectric layer pairs; and
 a memory film disposed laterally between the conductor/dielectric layer pairs and the semiconductor channel.

18. The 3D memory device of claim 11, wherein the slit contact is electrically connected to sources of at least two of the memory strings.

* * * * *